United States Patent
Feygenson et al.

(10) Patent No.: US 6,696,744 B2
(45) Date of Patent: Feb. 24, 2004

(54) INTEGRATED CIRCUIT HAVING A MICROMAGNETIC DEVICE AND METHOD OF MANUFACTURE THEREFOR

(75) Inventors: Anatoly Feygenson, Hillsborough, NJ (US); Dean P. Kossives, Glen Gardner, NJ (US); Ashraf W. Lotfi, Bridgewater, NJ (US); Lynn F. Schneemeyer, Westfield, NJ (US); Michael L. Steigerwald, Martinsville, NJ (US); R. Bruce Van Dover, Maplewood, NJ (US)

(73) Assignee: Agere Systems, Inc., Allentown, PA (US)

( * ) Notice: Subject to any disclaimer, the term of this patent is extended or adjusted under 35 U.S.C. 154(b) by 0 days.

(21) Appl. No.: 09/978,871

(22) Filed: Oct. 15, 2001

(65) Prior Publication Data

US 2002/0037434 A1 Mar. 28, 2002

Related U.S. Application Data

(60) Division of application No. 09/511,343, filed on Feb. 23, 2000, now Pat. No. 6,440,750, and a continuation-in-part of application No. 09/109,963, filed on Jul. 2, 1998, which is a continuation-in-part of application No. 08/872,250, filed on Jun. 10, 1997.

(51) Int. Cl.[7] .......................... H01L 29/40; H01L 43/00

(52) U.S. Cl. ...................................... 257/531; 257/422

(58) Field of Search .............................. 257/531, 422

(56) References Cited

U.S. PATENT DOCUMENTS

| | | |
|---|---|---|
| 3,729,807 A | 5/1973 | Fujiwara |
| 3,873,944 A | 3/1975 | Vaguine et al. |
| 4,016,050 A | 4/1977 | Lesh, deceased et al. |
| 4,103,267 A | 7/1978 | Olschewski |
| 4,109,297 A | 8/1978 | Lesh, deceased et al. |
| 4,695,908 A | 9/1987 | Imakoshi et al. |

(List continued on next page.)

FOREIGN PATENT DOCUMENTS

| | | |
|---|---|---|
| DE | 44 32 727 C1 | 3/1996 |
| EP | 0618 595 A1 | 10/1994 |
| EP | 0 681 319 A2 | 4/1995 |
| EP | 0 651 375 A1 | 5/1995 |
| EP | 0 716 433 A1 | 6/1996 |
| EP | 0 884 783 A2 | 12/1998 |
| JP | 01 053324 | 3/1989 |
| JP | 404 025102 A | 1/1992 |
| JP | 07 031147 A | 1/1995 |

OTHER PUBLICATIONS

Sullivan and Sanders;Measured Performance of a High–Power–Density Microfabricated Transformer in a DC–DC Converter; 1996; pp. 287–294.

Tsukamoto et al.; A Compact Buck–Converter Using a Thin–Film Inductor; 1996; pp. 422–426.

Inoue et al; 5 MHz Switching Micro DC–DC Converter Using Planar Inductor; 1996; pp 485–490.

Taylor; Design and Methodology for the Fabrication of an Integrated Electromagnet for Use as a Driving Element; 1995; pp. 15–22.

Frye et al.; Silicon–on–Silicon MCM's with Integrated Passive Components; 1992; pp. 155–158.

Wasa and Hayakawa: Handbook of Sputter Depositing Technology; 1992; pp 37–47.

*Primary Examiner*—Jerome Jackson

(57) ABSTRACT

A method of manufacturing an integrated circuit and an integrated circuit employing the same. In one embodiment, the method of manufacturing the integrated circuit includes (1) conformally mapping a micromagnetic device, including a ferromagnetic core, to determine appropriate dimensions therefor, (2) depositing an adhesive over an insulator coupled to a substrate of the integrated circuit and (3) forming the ferromagnetic core of the appropriate dimensions over the adhesive.

9 Claims, 14 Drawing Sheets

U.S. PATENT DOCUMENTS

| | | |
|---|---|---|
| 4,713,297 A | 12/1987 | Verbunt |
| 4,740,657 A | 4/1988 | Tsukagoshi et al. |
| 4,780,795 A | 10/1988 | Meinel |
| 4,826,787 A | 5/1989 | Muto et al. |
| 4,847,986 A | 7/1989 | Meinel |
| 4,853,080 A | 8/1989 | Anthony |
| 4,939,610 A | 7/1990 | Narishige et al. |
| 4,966,648 A | 10/1990 | Nakamura et al. |
| 4,975,671 A | 12/1990 | Dirks |
| 4,987,009 A | 1/1991 | Nakamura et al. |
| 5,037,517 A | 8/1991 | Randhawa |
| 5,070,317 A * | 12/1991 | Bhagat ................ 257/531 |
| 5,155,643 A | 10/1992 | Jones, Jr. et al. |
| 5,173,671 A | 12/1992 | Wendler et al. |
| 5,212,818 A | 5/1993 | Fukami |
| 5,276,763 A | 1/1994 | Gobel et al. |
| 5,312,674 A | 5/1994 | Haertling et al. |
| 5,323,292 A | 6/1994 | Brzezinski |
| 5,432,734 A | 7/1995 | Kawano et al. |
| 5,450,263 A | 9/1995 | Desaigoudar et al. |
| 5,452,163 A | 9/1995 | Coffey et al. |
| 5,469,334 A | 11/1995 | Balakrishnan |
| 5,495,125 A | 2/1996 | Uemura |
| 5,532,667 A | 7/1996 | Haertling et al. |
| 5,587,130 A | 12/1996 | Bao et al. |
| 5,590,250 A | 12/1996 | Lamping et al. |
| 5,610,449 A | 3/1997 | Takahashi et al. |
| 5,633,522 A | 5/1997 | Dorleans et al. |
| 5,659,462 A | 8/1997 | Chen et al. |
| 5,667,884 A | 9/1997 | Bolger |
| 5,777,386 A | 7/1998 | Higashi et al. |
| 5,787,568 A | 8/1998 | Crowell |
| 5,801,602 A | 9/1998 | Fawal et al. |
| 5,828,117 A | 10/1998 | Kondo et al. |
| 5,901,901 A | 5/1999 | Schneegans et al. |
| 5,933,327 A | 8/1999 | Leighton et al. |
| 5,939,641 A | 8/1999 | Lotfi et al. |
| 5,952,909 A | 9/1999 | Umeno et al. |
| 6,049,258 A | 4/2000 | Fawal et al. |
| 6,055,179 A | 4/2000 | Koganei et al. |
| 6,057,237 A | 5/2000 | Ding et al. |
| 6,118,351 A * | 9/2000 | Kossives et al. ........... 333/24.1 |
| 6,121,647 A | 9/2000 | Yano et al. |
| 6,160,721 A | 12/2000 | Kossives et al. |
| 6,163,234 A | 12/2000 | Kossives et al. |
| 6,191,495 B1 | 2/2001 | Kossives et al. |
| 6,249,039 B1 * | 6/2001 | Harvey et al. ............. 257/528 |
| 6,255,714 B1 | 7/2001 | Kossives et al. |
| 6,440,750 B1 | 8/2002 | Feygenson et al. |

* cited by examiner

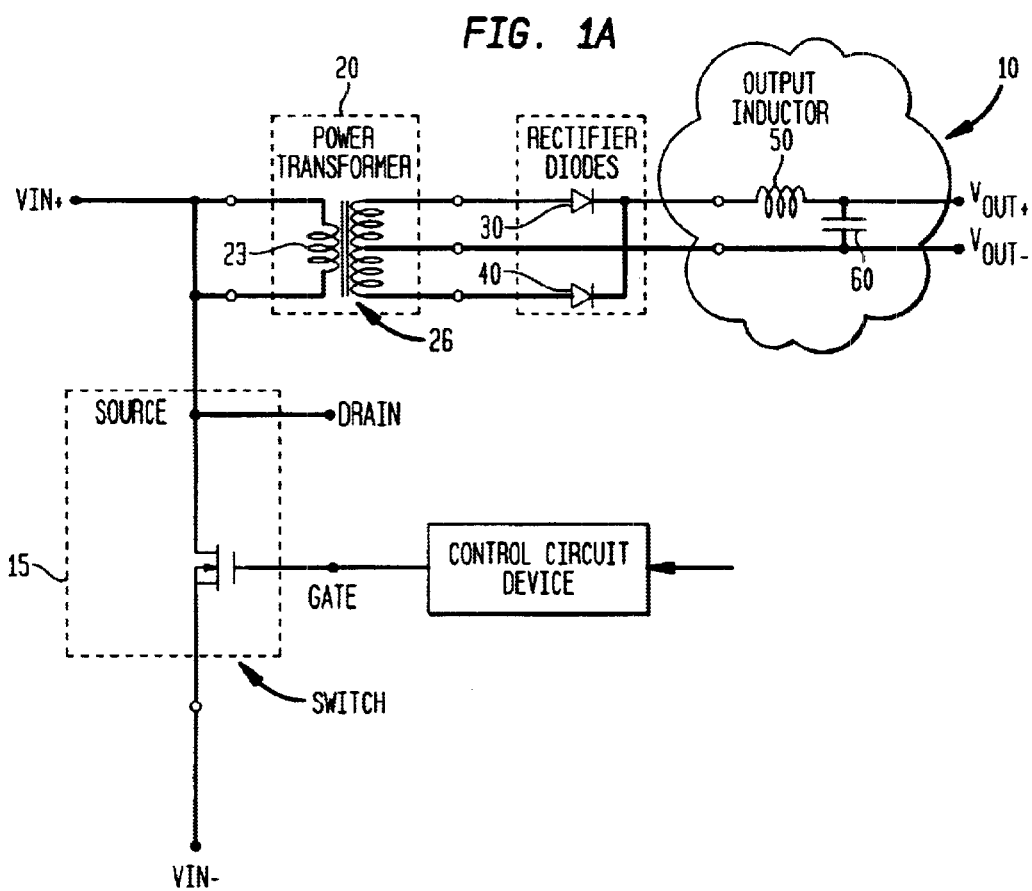

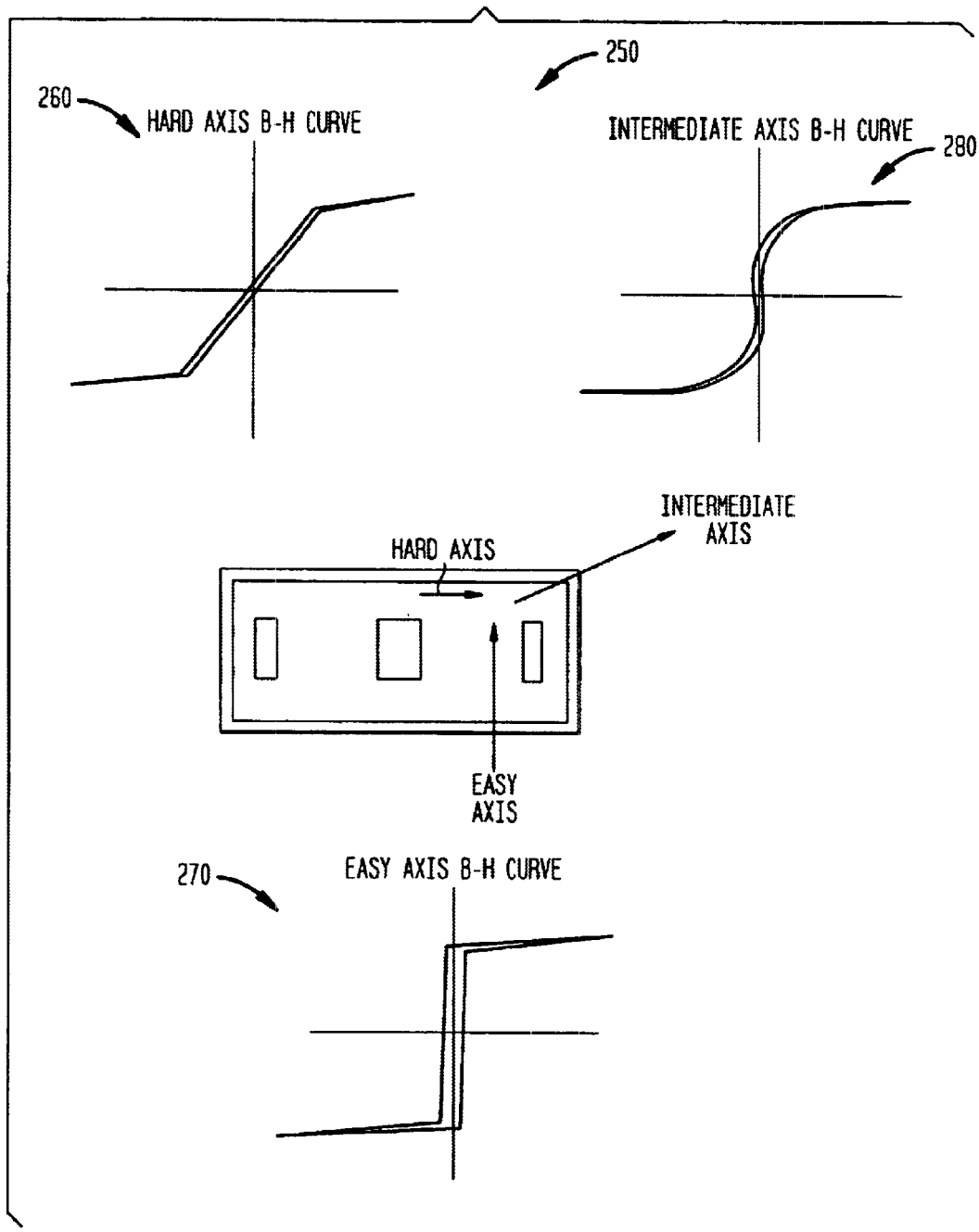

INTEGRATED CIRCUIT HAVING A MICROMAGNETIC DEVICE AND METHOD OF MANUFACTURE THEREFOR

This Application is a Divisional of prior application Ser. No. 09/511,343 filed on Feb. 23, 2000, U.S. Pat. No. 6,440,750, currently pending. The above-listed Application is commonly assigned with the present invention kind is incorporated herein by reference as if reproduced herein in its entirety under Rule 1.53(b).

CROSS-REFERENCE TO RELATED APPLICATIONS

This application is a continuation-in-part of U.S. patent application Ser. No. 09/109,963, entitled "A Micromagnetic Device for Data Transmission Applications and Method of Manufacture Therefor," to Kossives, et al., filed on Jul. 2, 1998, which is a continuation-in-part of U.S. patent application Ser. No. 08/872,250, entitled "A Micromagnetic Device for Power Processing Applications and Method of Manufacture Therefor," to Kossives, et al., filed on Jun. 10, 1997.

This application is also related to U.S. patent application Ser. No. 09/292,860, entitled "A Micromagnetic Device having an Anisotropic Ferromagnetic Core and Method of Manufacture therefor," to Kossives, et al., filed Apr. 16, 1999, and U.S. patent application Ser. No. 09/338,143, entitled "An Integrated Circuit having a Micromagnetic Device and Method of Manufacture therefor," to Kossives, et al., filed Jun. 22, 1999.

The above-listed applications are commonly assigned with the present invention and are incorporated herein by reference as if reproduced herein in their entirety.

TECHNICAL FIELD OF THE INVENTION

The present invention is directed, in general, to integrated circuits and, more specifically, to a method of manufacturing an integrated circuit with a micromagnetic device employing a conformal mapping technique and an integrated circuit employing the same.

BACKGROUND OF THE INVENTION

A magnetic device includes a magnetic core coupled to conductor windings such that magnetic flux flows in a closed path about the core. Magnetic devices are generally configured in an EE-type structure or a toroidal geometry. In the EE-type magnetic device, a first and second core-portion of the magnetic core surround the conductor windings. In the toroidal magnetic device, a first and second winding-portion of the conductor windings surround the magnetic core.

Micromagnetic devices (e.g., microinductors or microtransformers) are micron-scaled integrated circuit magnetic devices; the electromagnetic properties of the device are provided by the presence of the magnetic core and conductor windings. In the past, micromagnetic devices were only applicable to low-level signal applications (e.g., recording heads). With the advancement in production techniques for integrated circuits, it is now possible to fabricate micromagnetic devices for relatively large signal, power processing and high speed data transmission applications. For instance, micromagnetic devices may be employed in power systems for wireless communications equipment or in data transmission circuits.

While many power semiconductor devices (having ferrite cores, for instance) have been scaled down into integrated circuits, inductive elements at the present time remain discrete and physically large. Of course, there is a strong desire to miniaturize these inductive components as well. By extending thin-film processing techniques employed in power semiconductor devices to ferromagnetic materials, the size of the conventional discrete ferromagnetic-core inductive devices can be reduced significantly. Ferromagnetic materials such as alloys, however, have much higher saturation flux densities than ferrites (e.g., 10–20 kG verses 3 kG), thereby reducing the physical volume of the core for a given inductance and energy requirement. To limit the eddy current losses in the ferromagnetic materials, the materials must be fabricated in inordinately thin films. Processing thin-film ferromagnetic materials with traditional rolling and tape winding techniques proves to be very costly as the desired tape thicknesses drops below 0.001 inches (i.e., 25 $\mu$m). It is thus advantageous to produce such thin films by other integrated circuit deposition techniques such as sputtering or electroplating.

Another germane consideration associated with manufacturing micromagnetic devices is securing the ferromagnetic material to a silicon substrate or the like. More specifically, forming an adequate bond between the ferromagnetic material and an insulator coupled to the substrate is an important consideration. Many factors (such as oxide formation, melting point temperature, interposed contamination, affinity between materials and mechanical stress at the interface) may influence the adhesion of a thin film to a substrate. For instance, one technique readily employed in thin film manufacturing processes is the formation of an oxide-metal bond at the interface between the substrate and the film. The oxide-metal bond may be formed by employing an oxygen-active metal (such as tungsten or chromium) on an oxygen-bearing substrate (such as glass or ceramic) in conjunction with a refractory metal (such as tantalum or tungsten). With regard to contaminants, it is advantageous to remove any impurities interposed on the substrate. Cleaning methods vary in effectiveness and the method selected depends on the ability of the deposition process to dislodge contaminant atoms. As an example, different cleaning techniques may be employed with sputtering or electroplating.

Of course, the ultimate consideration with regard to the adhesion properties depends on the materials employed. While others have attempted to address the adhesion of ferromagnetic materials to an insulator coupled to a substrate [e.g., *Measured Performance of a High-Power-Density Microfabricated Transformer in a DC-DC Converter*, by Charles R. Sullivan and Seth R. Sanders, IEEE Power Electronics Specialists Conference, p. 287–294 (July 1996), which is incorporated herein by reference], to date, the problem remains unresolved. The development of an adhesive material that simultaneously forms a bond with the insulator and the ferromagnetic material such that thin-film processing can be applied to inductive elements would provide a foundation for the introduction of power processing or data transmission micromagnetic integrated circuits.

Regarding the magnetic properties, current micromagnetic devices are typically isotropic in that their properties are the same when measured in different directions. Although anisotropic properties are generally known in the domain of magnetics, anisotropic properties have not been employed in the design of micromagnetic devices due, in part, to the limitations as addressed above regarding the fabrication of micromagnetic integrated circuits. Micromagnetic devices with the ability to induce a designed magnetic anisotropic property into the core, having a desired direction and characteristic, would be very useful.

A further problem arises with magnetic field fringing effects in the magnetic material such as near gaps of the core of the micromagnetic device. This problem has been addressed in the case of less complex magnetic structures through the use of conformal maps that map a curvilinear field from a z=x+iy domain to a uniform w=u+iv domain in which energy remains invariant under the transformation. The Schwartz-Christoffel transformation, T[w(z)], may be obtained for polygonal areas with any number of vertices including those at infinity. The present solutions, however, only apply to less complex magnetic structures.

W. J. Gibbs in *Conformal Transformations in Electrical Engineering*, Chapman & Hall Ltd., London 1958, which is incorporated herein by reference, addresses magnetic field fringing effects for magnetic devices having uniform pole faces. In this instance, the solution is possible by using symmetry and relatively large dimensions in non-critical directions, such as a small uniform gap and long uniform magnetic pole pieces. Then, a uniform faced pole may be modeled with one vertex at the corner and two others at infinity and the origin yielding three vertices altogether. (See also, *Conformal Mapping: Methods and Applications,* by R. Schinzinger and P. A. A. Laura, ElSevier Science Publications, Amsterdam, §7.3.1, 1991, which is also incorporated herein by reference). Other more complicated structures involving devices having parallel plates of finite thickness separated by a gap have been solved with an integral transformation with four vertices. (See *A study of the field around magnetic heads of finite length,* by I. E1Abd, IEEE trans, on Audio, AU-11, pp. 21–27, 1963 and §7.3.2. of Schinzinger, et al.). The solution for more complex magnetic structures, however, remains unsolved.

Accordingly, what is needed in the art is a conformal mapping technique that is applicable to micromagnetic devices that overcomes the deficiencies in the prior art and a method of manufacturing an integrated circuit having a micromagnetic device that employs conformal mapping to advantage.

SUMMARY OF THE INVENTION

To address the above-discussed deficiencies of the prior art, the present invention provides a method of manufacturing an integrated circuit and an integrated circuit employing the same. In one embodiment, the method of manufacturing the integrated circuit includes (1) conformally mapping a micromagnetic device, including a ferromagnetic core, to determine appropriate dimensions therefor, (2) depositing an adhesive over an insulator coupled to a substrate of the integrated circuit and (3) forming the ferromagnetic core of the appropriate dimensions over the adhesive.

The present invention introduces, in one aspect, the broad concept of providing a micromagnetic device that employs a conformal mapping technique to determine the appropriate size therefor. The conformal mapping technique may be employed to optimize the dimensions of the micromagnetic device to meet specific design criteria and exhibit desired magnetic properties. For instance, very fine features may be designed into the core of the micromagnetic device or windings may be formed about the core to better utilize the space thereabout. As a result of the aforementioned technique, the magnetic field of the device may be mapped and the core reshaped to accommodate magnetic flux variations associated with different geometries thereby creating micromagnetic devices with substantially uniform flux densities and improving the operational efficiencies thereof.

In one embodiment of the present invention, the act of conformally mapping includes transforming the appropriate dimensions to a hyperelliptical representation. In a related, but alternative embodiment, the act of conformally mapping further includes reducing the hyperelliptical representation to at least one elliptical integral. In still another related, but alternative embodiment, the act of conformally mapping further includes solving the at least one elliptical integral to render at least an approximation of a fringing magnetic field magnitude of the micromagnetic device. While the derivation of the aforementioned steps in relation to a specific core geometry will hereinafter be described in detail, other conformal mapping steps capable of mapping a micromagnetic device to achieve the desired magnetic properties are well within the broad scope of the present invention.

The foregoing has outlined, rather broadly, features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which:

FIG. 1A illustrates a schematic diagram of an embodiment of a power processing circuit constructed according to the principles of the present invention;

FIG. 2B illustrates a top view of a micromagnetic device showing the resulting B-H curves for various external magnetic field orientations at deposition;

DETAILED DESCRIPTION

Figure 1B:
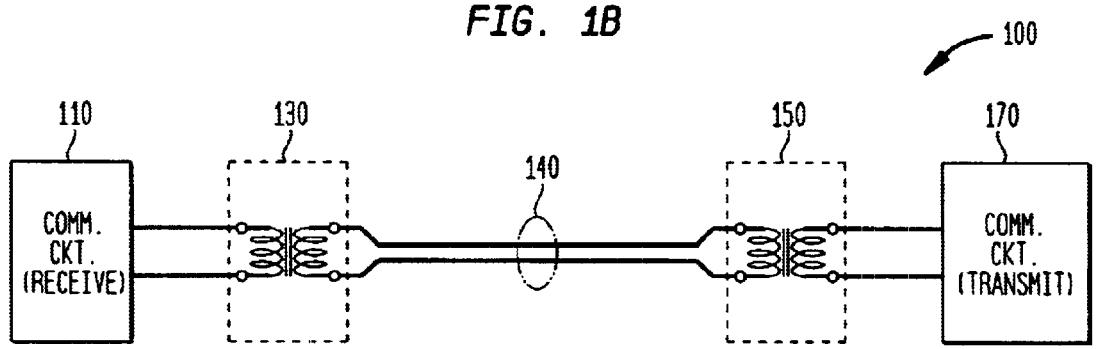
FIG. 1B illustrates a schematic diagram of an embodiment of a data transmission circuit constructed according to the principles of the present invention.

Referring initially to FIG. 1A, illustrated is a schematic diagram of an embodiment of a power processing circuit 10 constructed according to the principles of the present invention. The power processing circuit 10 includes a power train having a conversion stage including a switching circuit 15 for receiving input electrical power VIN and producing therefrom switched electrical power. The power processing circuit 10 further includes a filter circuit (including an output inductor 50 and output capacitor 60) for filtering the switched electrical power to produce output electrical power (represented as a voltage $V_{OUT}$). The power processing circuit 10 still further includes a power micromagnetic device (e.g., transformer) 20, having a primary winding 23 and a secondary winding 26, and a rectifier (including rectifying diodes 30, 40) coupled between the power conversion stage and the filter stage. The transformer 20 is constructed according to the principles of the present invention as hereinafter described. The transformer 20 and power processing circuit 10 are submitted for illustrative purposes only and other power micromagnetic devices and applications therefor are well within the broad scope of the present invention.

Turning now to FIG. 1B, illustrated is a schematic diagram of an embodiment of a data transmission circuit 100 constructed according to the principles of the present invention. The data transmission circuit 100 includes a first communications circuit 110 for receiving a communications signal. The data transmission circuit 100 further includes a second communications circuit 170 for transmitting the communications signal. The data transmission circuit 100 further includes a transmission line cable 140 having a characteristic impedance $Z_o$, coupling the first communications circuit 110 to the second communications circuit 170. The data transmission circuit 100 still further includes first and second data transmission micromagnetic devices 130, 150, coupled between the transmission line cable 140 and the first and second communications circuits 110, 170, respectively. The first and second data transmission micromagnetic devices 130, 150 are constructed according to the principles of the present invention as hereinafter described.

In the illustrated embodiment, the first and second data transmission micromagnetic devices 130, 150 may perform several functions including, without limitation, voltage transformation, impedance transformation from a transmitter impedance of the second communications circuit 170 to the characteristic impedance $Z_o$ and from the characteristic impedance $Z_o$ to a receiver impedance of the first communications circuit 110. Other functions include unbalanced to balanced signal conversion and electromagnetic interference suppression. The data transmission circuit 100 and first and second data transmission micromagnetic devices 130, 150 are submitted for illustrative purposes only and other data transmission micromagnetic devices and applications therefor are well within the broad scope of the present invention.

Figure 2A:
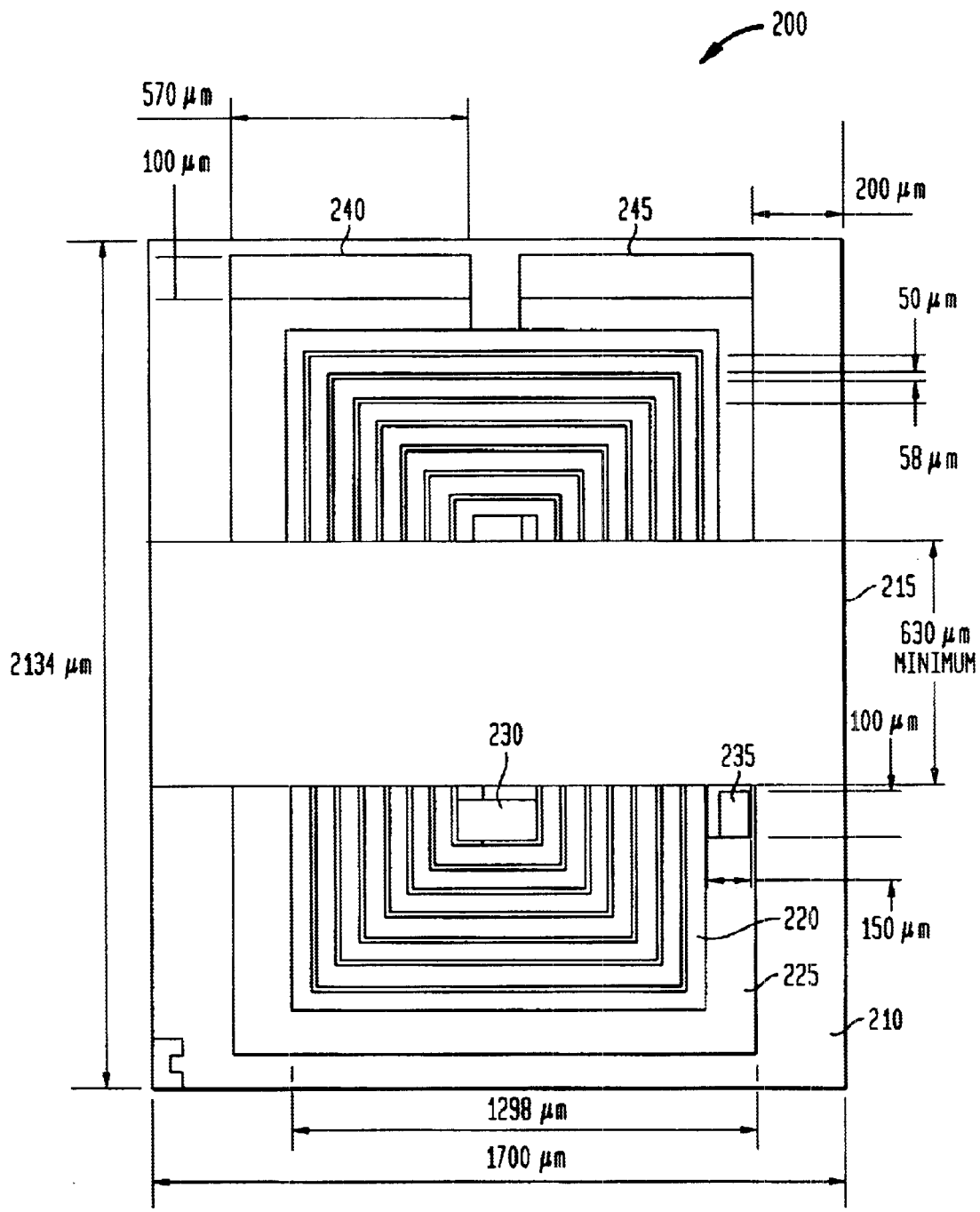
FIG. 2A illustrates a top view of an embodiment of a micromagnetic device constructed according to the principles of the present invention.

Turning now to FIG. 2A, illustrated is a top view of an embodiment of a micromagnetic device 200 constructed according to the principles of the present invention. The micromagnetic device 200 is an EE-type transformer device. The micromagnetic device 200 includes a ferromagnetic core having a first core-portion 210 and a second core-portion 215. While the ferromagnetic core may be composed of an alloy (e.g., a permalloy™ composed of nickel-iron including about 80% nickel and 20% iron), other ferromagnetic materials are well within the broad scope of the present invention. The micromagnetic device 200 also includes conductive windings having a primary winding 220 and a secondary winding 225. Of course, the windings may be formed from any conductive material. The primary winding 220 terminates in a plurality of terminals 230, 235; the secondary winding 225 terminates in a plurality of terminals 240, 245.

The first and second core-portions 210, 215 surround the primary and secondary windings 220, 225. The magnetic flux of the micromagnetic device 200 predominantly flows along the width of the ferromagnetic core. As a result, the ferromagnetic core is anisotropic, thereby controlling hysteresis losses at higher frequencies (e.g., above 10 MHZ). The first and second core-portions 210, 215 may be coupled together by magnetic vias (when anisotropic characteristics and control are desired) or remain separate (when an air gap is desired). The EE-type structure effectively controls the permeability of the ferromagnetic core by regulating the direction of the induced anisotropy with respect to the magnetic field vector.

With regard to the ferromagnetic material, the total thickness thereof is selected based on the inductance requirements of the device. For operation at relatively high frequencies (e.g., above 10 MHZ), eddy currents induced in the ferromagnetic materials can become problematic due to the resulting low resistivity (e.g., $\rho \sim 20-100 \, \mu\Omega cm$). To reduce the eddy currents, the magnetic film thickness of the ferromagnetic material should be limited to a fraction of the skin depth $\delta$ [where $\delta=(\rho/\pi f \mu)^{1/2}$ for a given frequency f of operation]. For instance, at 8 MHZ and $\mu=1000$, the skin depth is about 2.5 $\mu$m; thus, to limit the effect of the eddy currents, the film thickness should be below about 2 $\mu$m (obviously, thinner films are necessary as the permeability increases). When the inductance specification requires a larger thickness, insulated multiple layers of film (with each layer not exceeding the necessary skin thickness) should be employed.

For use in data transmission applications, for instance, performance of the micromagnetic device 200 at high data transmission rates may be affected by parasitic elements. Leakage inductances and interwinding capacitances may cause distortions, overshoots, and backswings that may place a transmitted pulse of data outside an acceptable transmission template. Such parasitic elements may be influenced by a physical size and arrangement of the micromagnetic device 200. The parasitic elements, however, may be reduced by miniaturizing the micromagnetic device 200 using the principles of the present invention.

Turning now to FIG. 2B, illustrated is a top view of a micromagnetic device 250 showing the resulting B-H curves for various external magnetic field orientations at deposition. The B-H curve is a plot of magnetic flux density (B) verses magnetic magnetizing force (H) for a magnetic material. As discussed in FIG. 2A, the magnetic flux of the micromagnetic device 200 predominantly flows along the width of the ferromagnetic core. This effect causes the ferromagnetic core to be anisotropic due to the construction geometry. An anisotropy property may also be introduced during the deposition process, when conducted in an external magnetic field, using an energized solenoid or permanent magnet. The external magnetic field is normally uniform and may be applied at levels of 10–500 Oersteds [("Oe"); 8000–40000 A/m]. Of course, some cases may exist where the application of a non-uniform external magnetic field may be useful. In the present embodiment, the induced anisotropy produces both a hard axis and an easy axis, along which the permeability is a minimum and maximum, respectively. Additionally, the hard axis and the easy axis are seen to be substantially transverse in this embodiment. Of course, other embodiments may employ other orientations between the hard axis and the easy axis.

The micromagnetic device 250 exhibits a hard axis B-H curve 260 and an easy axis B-H curve 270. The permeability is proportional to the slope of the B-H curve, typically defined in the middle region of the B-H curve, which corresponds to the non-saturated operating region of the magnetic core. In some cases, the permeability may be increased five-fold from the hard axis to the easy axis as a result of the anisotropy. An intermediate axis B-H curve 280 is also shown, which exhibits characteristics different from the hard axis and easy axis B-H curves 260, 270. The intermediate B-H curve 280 is typical of tailored B-H curves, which may be created during deposition of the micromagnetic core by orienting the external magnetic field in a desired direction.

Figure 3:
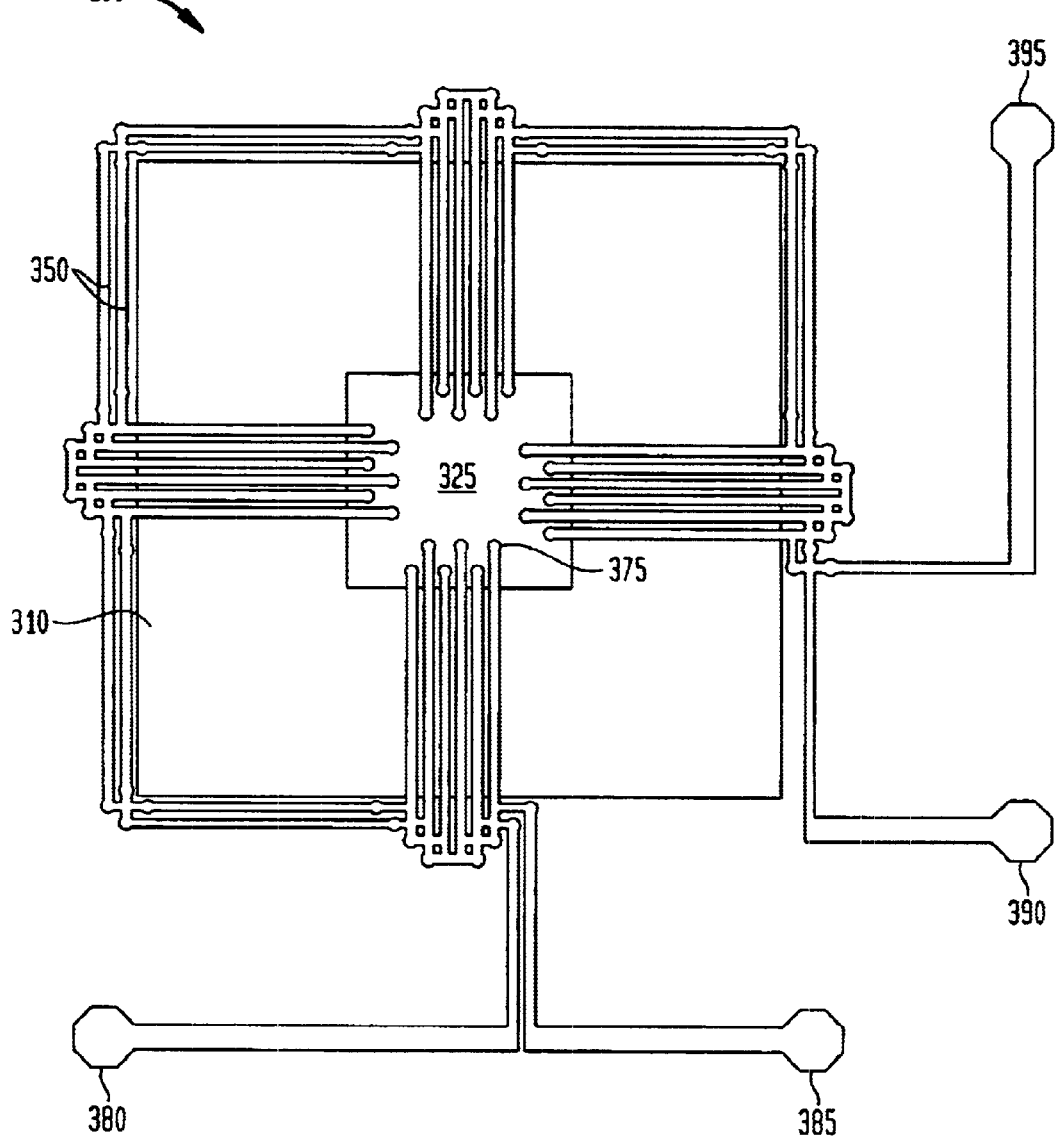
FIG. 3 illustrates a top view of another embodiment of a micromagnetic device constructed according to the principles of the present invention.

Turning now to FIG. 3, illustrated is a top view of another embodiment of a micromagnetic device 300 constructed according to the principles of the present invention. The micromagnetic device 300 is a toroidal transformer device. The micromagnetic device 300 includes a ferromagnetic core 310 (proximate a window 325) and conductive windings (collectively designated 350) that surround the ferromagnetic core 310 through inner-layer connection vias (one of which as designated 375) and terminate in a plurality of terminals 380, 385, 390, 395. The inner-layer connection vias 375 lie within the window 325.

Rules regarding line space and via-to-via distance determine the size of the window 325. Obviously, with the trend towards smaller devices, a smaller window dimension is desirable. The dimension of the window 325, however, is limited by the thickness of the ferromagnetic material necessary to achieve the required inductance characteristics. For example, the inductance of a toroidal device is maximized if the toroid is generally circular. The inductance is less if the toroid is formed into a square (~25% less), degrading further as the square is elongated into a rectangle. The inductance L for a square toroid having a core width to meet a minimum window dimension, is:

$$L = \mu_0 [N^2 t]/4(1+\pi)$$

where N is the number of turns of the conductive windings 350 and t is the thickness of the film. The size of the window 325 is determined by the minimum via size, via-to-via clearance and the number of vias (related to the number of primary and secondary turns). Therefore, to reduce the die size of the device, a larger core thickness is necessary to obtain an equivalent inductance to an EE ferromagnetic core of equal winding turns and core width.

Remember that, for the EE-type structure, fewer winding connection vias are required, thereby reducing the amount of die space necessary to couple the windings to the core. Toroidal transformers, however, offer a relatively flat and smooth surface for the deposition of the ferromagnetic material, thereby reducing the formation of stresses that may degrade the magnetic properties of the film deposited thereon. This is especially important when the ferromagnetic material has a high magnetostriction constant. The EE-type structure also requires special provisions to create a continuous magnetic path from the first core-portion to the second core-portion. This is accomplished by introducing vias within the central core region and at the two outer core edges. The vias provide connectivity for the ferromagnetic material such that the first and second core-portions are coupled together continuously. The vias, however, are a source of stress concentration that require additional slope reduction to decrease the accumulated stresses.

While FIGS. 2 and 3 illustrate both the EE-type and toroidal transformer device (including the advantages and disadvantages thereof), other micromagnetic devices (including variations of the foregoing devices) and applications therefor are well within the broad scope of the present invention.

Figure 4:
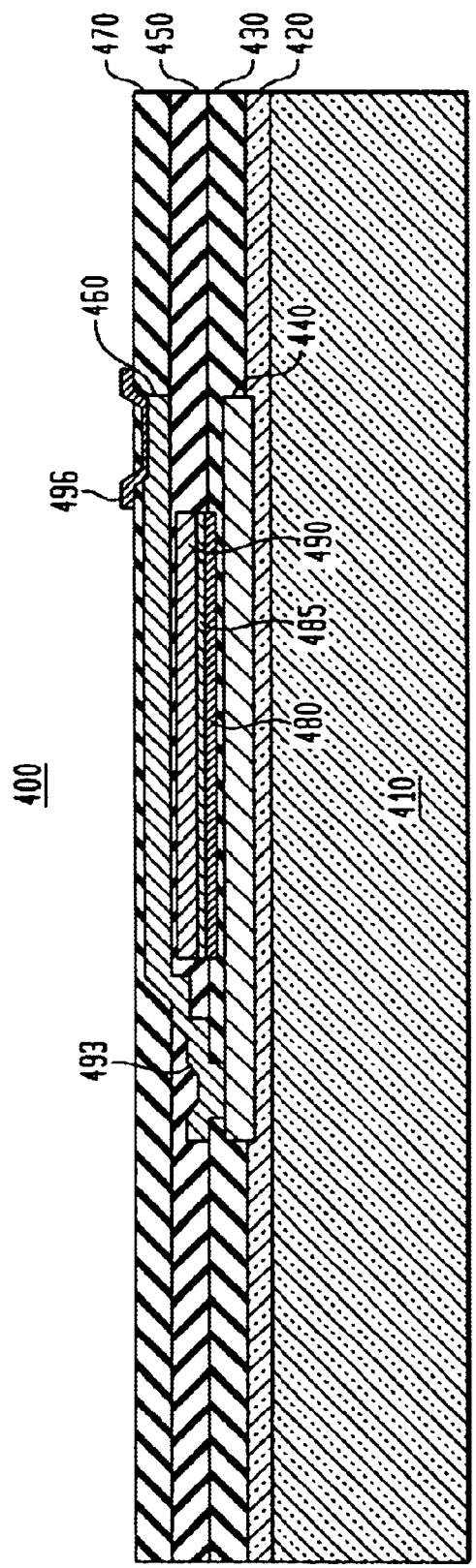
FIG. 4 illustrates a cross-sectional view of an embodiment of an integrated circuit including a micromagnetic device constructed according to the principles of the present invention.

Turning now to FIG. 4, illustrated is a cross-sectional view of an embodiment of an integrated circuit 400 including a micromagnetic device constructed according to the principles of the present invention. The integrated circuit 400 may be employed in a power processing, data transmission or other circuits. The integrated circuit 400 includes a substrate (composed of, for instance, silicon, glass, ceramic or the like) 410 having a passivation layer (e.g., silicon-dioxide) 420 formed thereon using conventional formation processes such as a thermal growing process. The integrated circuit 400 further includes first and second conductive winding layers (composed of, for instance, aluminum or any other conductive material) 440, 460 surrounded by first, second and third insulative layers or insulators 430, 450, 470. The integrated circuit 400 still further includes an adhesive (a metallic adhesive in the illustrated embodiment) that contains a first adhesive layer (e.g., chromium) 480 and a second adhesive layer (e.g., silver) 485. The integrated circuit 400 still further includes a ferromagnetic core 490. The integrated circuit 400 still further includes a plurality of inner-layer vias (collectively designated 493) that provide multiple paths between layers of the integrated circuit 400 and a terminal 496 for connection to another device.

The passivation layer 420 and first, second and third insulative layers 430, 450, 470 may be formed from an inorganic composition (e.g., silicon-dioxide, aluminum-dioxide, beryllium-dioxide), an organic polymer (e.g., a polyimide) or any other insulating material. The metallic adhesive is an inorganic-based material that is substantially (about 70%) free of titanium. While the first adhesive layer 480 generally contains materials selected from Group 4 elements (such as zirconium and hafnium; excluding about a 70% or more composition of titanium), Group 5 elements (such as vanadium, niobium and tantalum) and Group 6 elements (such as chromium, molybdenum and tungsten), other elements are well within the broad scope of the present invention. It should be noted that the above classifications of elements are compatible with the new International Union of Pure and Applied Chemistry notation indicated in the periodic table. Additionally, while the second adhesive layer 485 generally contains metals such as gold, silver, platinum, palladium and copper, other materials susceptible to plating a ferromagnetic material are well within the broad scope of the present invention. Again, while the ferromagnetic core 490 may be composed of an alloy (such as a permalloy™ or a cobalt-iron composition), other ferromagnetic materials (e.g., an amorphous nickel phosphide) are well within the broad scope of the present invention.

As previously mentioned, it is desirable to manufacture micromagnetic devices as integrated circuits. Employing alloys in the ferromagnetic core 490 is attractive since the relatively low magnetostriction constants may reduce the stress associated with the deposition processes. If relatively high stresses are associated with the deposition process, the magnetic properties of the integrated circuit 400 may be degraded and the thin films may lack the requisite adhesive properties necessary to facilitate the deposition of the integrated circuit 400. Obviously, an adhesive that counteracts the potential built-up stress in the films should be provided.

Several attempts have been undertaken to uncover an adhesive that provides a secure interface to a ferromagnetic material and an insulator. For instance, when a metal such as silver is exclusively used as the adhesive, the ferromagnetic material/silver interface is stronger than the insulator/silver interface. As a result, the ferromagnetic material and silver films may be peeled away from the substrate at a specified testing peel force (using a standard adhesion evaluation technique for less than 1 kG/cm$^2$). Conversely, when chromium is exclusively used as the adhesive, the insulator/chromium interface is stronger than the ferromagnetic material/chromium interface. As a result, the ferromagnetic material and silver films may be peeled away from the substrate at a specified testing peel force (using a standard adhesion evaluation technique for less than 1 kG/cm2). Additionally, the chromium does not provide an adequate seed layer for plating the ferromagnetic material. In conjunction with present invention, therefore, an adhesive (as described above) is disclosed that provides an adequate bond between the ferromagnetic core 490 and the insulators 430, 450, 470 coupled to the substrate 410 to facilitate the fabrication of the integrated circuit 400.

Figure 5:
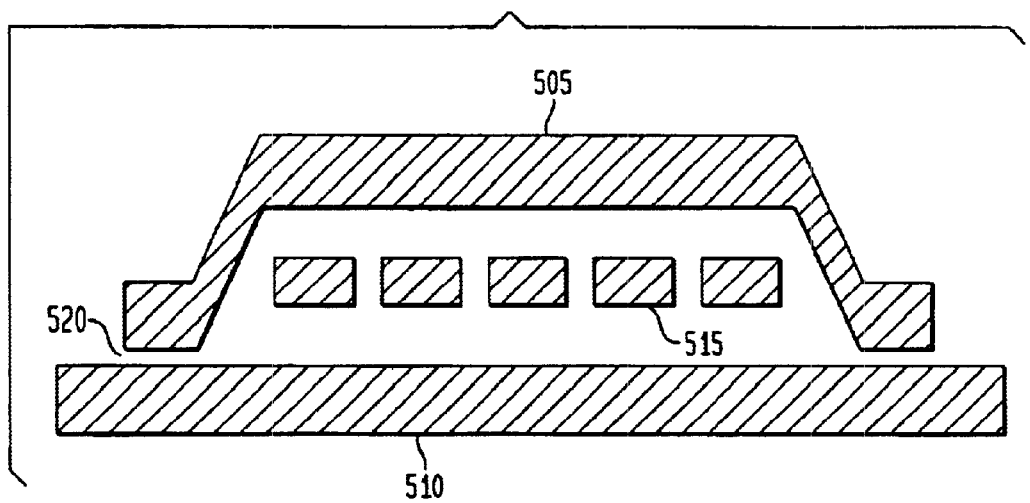
FIG. 5 illustrates a cross-sectional view of another embodiment of a micromagnetic device constructed according to the principles of the present invention.

Turning now to FIG. 5, illustrated is a cross-sectional view of another embodiment of a micromagnetic device 500 constructed according to the principles of the present invention. The micromagnetic device 500 includes a first magnetic core portion 505, a second magnetic core portion 510 and a winding 515. The magnetic core portions 505, 510 are composed of a ferromagnetic material and have a flanged gap 520 therebetween. In this embodiment, the method of manufacturing the micromagnetic device 500 includes conformal mapping to determine the appropriate dimensions therefor. The conformal mapping technique is employed to optimize the dimensions of the micromagnetic device 500 to meet specific design criteria and exhibit desired magnetic properties.

In the present embodiment, the act of conformally mapping includes transforming the appropriate dimensions of the micromagnetic device 500 to hyperelliptical representations. The act of conformally mapping further includes reducing the hyperelliptical representation to at least one elliptical integral and then solving all elliptical integrals to render at least an approximation of a fringing magnetic field magnitude of the micromagnetic device. Of course, other conformal mapping steps capable of mapping a micromagnetic device to achieve the desired magnetic properties are well within the broad scope of the present invention.

As stated earlier, conformally mapping the flanged gap 520 in the micromagnetic device 500 gives rise to hyperelliptic integrals in inductance calculations for the core structure of the micromagnetic device 500. Indeed, the hyperelliptic integrals arise in higher order conformal transformations of polygons with, ordinarily, more than four vertices. The method is based on the principle of separation of moduli to accomplish a solution. The method employed in the present embodiment provides an accurate, closed-form, analytic solution that may be used in the optimization of the design of inductors or transformers, especially such devices with protruding flanges at the gap region.

With the bent first magnetic core portion 505 shown in FIG. 5, the problem now involves five vertices and the integral transformation is then hyperelliptic. The integral transformation can be evaluated numerically for a set of transformation parameters, but the reverse problem of determining the transformation parameters for a given physical geometry is quite difficult. The hyperelliptic integral cannot be expressed in terms of complete elliptic integrals. The mathematical treatment uses geometric properties to reduce hyperelliptic integrals to complete elliptic integrals. Furthermore, it allows the computation of the transformation parameters directly from a given geometry.

Figure 6A:
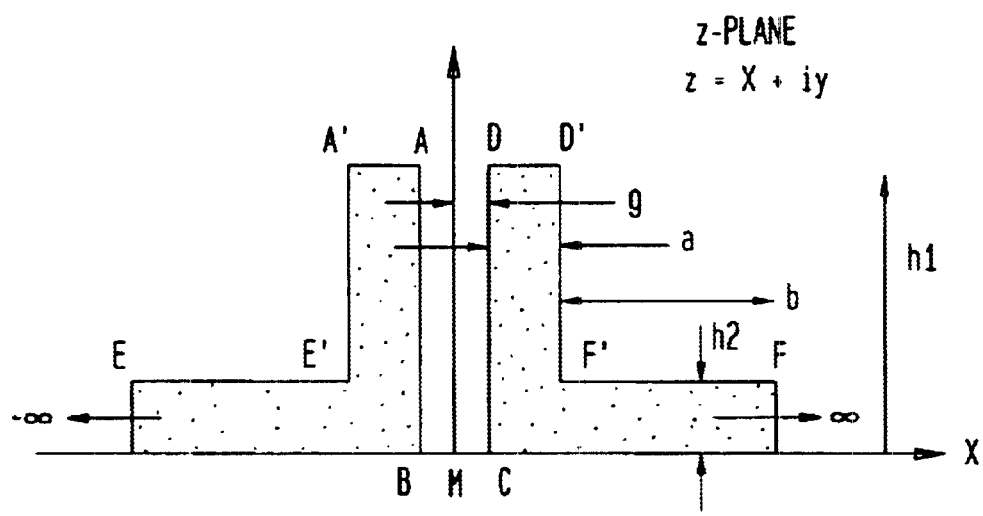
FIGS. 6A, 6B and 6C illustrate geometric representations of the flanged gap of FIG. 5.
Figure 6B:
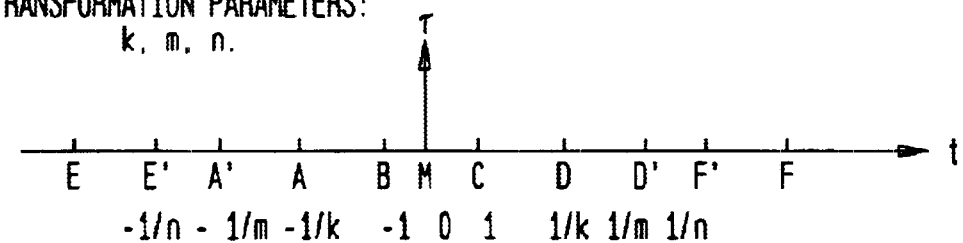
Figure 6C:
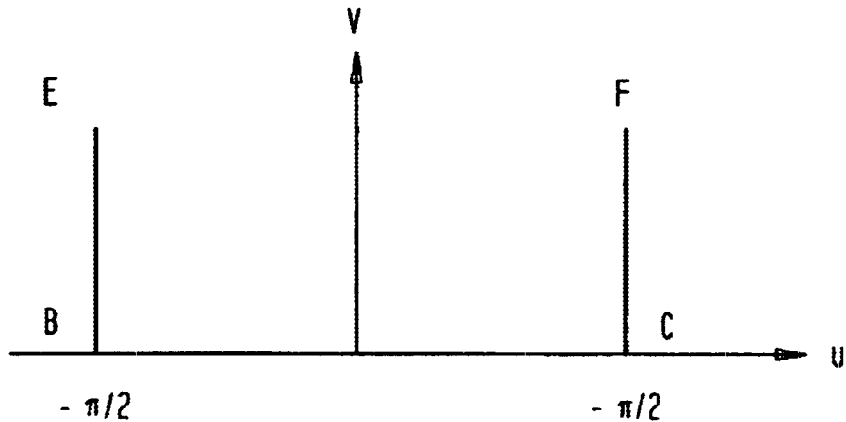

Turning now to FIGS. 6A, 6B and 6C, illustrated are geometric representations of the flanged gap 520 of FIG. 5. FIG. 6A illustrates a geometric representation of the flanged gap 520 shown in a z-plane. FIG. 6B illustrates a geometric representation shown in a T-plane. FIG. 6C illustrates a geometric representation shown in a w-plane. The z-plane of FIG. 6A is first transformed to the intermediate T-plane of FIG. 6B and then transformed to the w-plane of FIG. 6C where the field is uniform.

In the T-plane, the interior of the polygon maps on the upper half of the T plane and the corresponding points M, C, B, D, A, D', A', F', E', F, E map to values 0, ±1, 1/k, 1/m, 1/n, ∞ respectively, along the real T-axis. The Schwartz-Christoffel method yields the transformation differential equation as set forth below.

$$\frac{dz}{dt} = A\left(t + \frac{1}{n}\right)^{-1/2}\left(t + \frac{1}{m}\right)^{1/2} \cdot \quad (1)$$

$$\left(t + \frac{1}{k}\right)^{1/2}(t+1)^{-1/2}(t-1)^{-1/2} \cdot \left(t - \frac{1}{k}\right)^{1/2}\left(t - \frac{1}{m}\right)^{1/2}\left(t - \frac{1}{n}\right)^{-1/2}$$

$$z(t) = A\int \sqrt{\frac{(1-k^2t^2)\cdot(1-m^2t^2)}{(1-t^2)\cdot(1-n^2t^2)}}\,dt + B \quad (2)$$

The transformation contains the constants A, B, and the moduli k, m, n, all of which will hereinafter be determined. Notice that the integral contains four rooted quadratics with three moduli, which leads to its classification as hyperelliptic. (See, for instance, *Analysis and Computation of Electric and Magnetic Field Problems,* by K. J. Binns and P. J. Lawrenson, Pergamon Press, 2$^{nd}$. Ed., Oxford, 1973, which is incorporated herein by reference.) Given the correlation between the physical dimensions thereof, the relationships can be reduced to complete elliptic integrals.

The constant B is observed to be zero since at point M both z=0 and t=0. The constant of integration, A, can be determined from the following equations.

$$A = \frac{g}{\Psi_1}, \quad (3)$$

$$\Psi_1 = z(1) = \int_0^1 \sqrt{\frac{(1-k^2t^2)\cdot(1-m^2t^2)}{(1-t^2)\cdot(1-n^2t^2)}}\,dt. \quad (4)$$

The solution can be determined by considering the relative dimensions of the geometry. Assuming that a,h$_1$,h$_2$>>g, then the point 1/k>>1 (a readily feasible condition). Consequently, $$\Psi_1 \approx \int_0^1 \sqrt{\frac{(1-k^2t^2)}{(1-t^2)}}\,dt - E(1,k) \quad (5)$$

where E(1,k)=E(k)=E is the complete Jacobian elliptic integral of the second kind with modulus k, the complementary modulus k'=$\sqrt{1-k^2}$ and the associated complementary integral E(1,k')=E'(k)=E'. One can approximate E and E' under these conditions by the following expansions.

$$E \approx \frac{\pi}{2} - k^2\left(\frac{\pi}{2} - 1\right) \quad (6)$$

$$E' \approx 1 + k^2\left(\frac{\pi}{2} - 1\right)$$

Therefore, employing the aforementioned relationships, Equation (3) may be solved to yield the following relationship.

$$A = \frac{g}{E(1, k)} = \frac{g}{\frac{\pi}{2} - k^2\left(\frac{\pi}{2} - 1\right)}. \quad (7)$$

To determine the modulus k, the condition at point D is employed to yield the following relationship.

$$\Psi_k = z\left(\frac{1}{k}\right) = \int_0^{1/k} \sqrt{\frac{(1 - k^2 t^2) \cdot (1 - m^2 t^2)}{(1 - t^2) \cdot (1 - n^2 t^2)}} \, dt \quad (8)$$

$$\approx \int_0^{1/k} \sqrt{\frac{(1 - k^2 t^2)}{(1 - t^2)}} \, dt = E\left(\frac{1}{k}, k\right).$$

The following identity of elliptic integrals applies, $$E\left(\frac{1}{k}, k\right) = E + i(K' - E') \quad (9)$$

where K'=K(k') is the complete elliptic integral of the first kind to modulus k'. (See also W. J. Gibbs). Using the identity above and the condition at point D, then, $$g + ih_1 = A \cdot (E + i(K' - E')) \quad (10)$$

$$\frac{h_1}{g} = \frac{K' - E'}{E}.$$

which is akin to the result for a recording head. The asymptotic expansion, $$\lim_{k \to 0} K' = \ln\left(\frac{4}{k}\right),$$

is now employed. (See *Table of Integrals*, by I. S. Gradshteyn and I. M. Ryzhik, Series and Products, Academic Press, San Diego, 1980, §2.2713, which is incorporated herein by reference.) A solution for k can be obtain via the following equation.

$$\frac{h_1}{g} \approx \frac{\ln(4/k) - 1}{\pi/2} \quad (11)$$

$$k = 4e^{-\left(1 + \frac{\pi}{2} \frac{h_1}{g}\right)}.$$

Next, to estimate the value of the parameter m, in the interval $1/k \leq t \leq 1/m$, and with $t^2 \gg 1$, $n^2 t^2 \ll 1$, the condition at point D' yields the following relationship.

$$a = A \int_{1/k}^{1/m} \sqrt{\frac{(1 - k^2 t^2) \cdot (1 - m^2 t^2)}{(1 - t^2) \cdot (1 - n^2 t^2)}} \, dt \quad (12)$$

$$\approx A \int_{1/k}^{1/m} \frac{-kt}{-t} \sqrt{(1 - m^2 t^2)} \, dt.$$

The integral is evaluated and further provides, $$\frac{a}{A} = \frac{\pi}{4} \cdot \frac{k}{m} - \frac{1}{2}\sqrt{1 - \frac{m^2}{k^2}} - \frac{k}{2m}\sin^{-1}\frac{m}{k} \quad (13)$$

which can be solved for m. (See also I. S. Gradshteyn, et al, §2.263.1). Equation (13) provides solutions with accuracies better than 10% for ratios of k/m>20.

The calculation of the modulus n is found by solving the boundary condition at point F' as set forth below.

$$i(h_1 - h_2) = A \int_{1/m}^{1/n} \sqrt{\frac{(1 - k^2 t^2)(1 - m^2 t^2)}{(1 - t^2)(1 - n^2 t^2)}} \, dt. \quad (14)$$

with the condition that $t^2 \gg 1$, $1/k^2$ in the interval $1/m \leq t \leq 1/n$, the integral in Equation (14) provides the following relationship.

$$i(h_1 - h_2) \approx A \cdot k \cdot \int_{1/m}^{1/n} \sqrt{\frac{1 - m^2 t^2}{1 - n^2 t^2}} \, dt. \quad (15)$$

The integral can now be evaluated exactly by means of the Jacobi Elliptic functions and reduced to complete elliptic integrals.

$$\int_y^a \sqrt{\frac{t^2 - b^2}{a^2 - t^2}} \, dt = ak_n^2 \int_0^{u_1} cn^2 u \cdot du = ak_n^2 \cdot C_2 \Big|_0^{u_1} \quad (16)$$

$$C_2 = \int cn^2 u \, du = \frac{1}{k_n^2}[E(u) - k_n'^2 u]$$

$$k_n^2 = \frac{(a^2 - b^2)}{a^2}$$

(See also, *Handbook of Elliptic Integrals for Engineers and Physicists*, P. F Byrd and M. D. Friedman, Springer-Verlag, Berlin, 1954, §218.03, which is incorporated herein by reference.)

The Jacobi elliptic function includes the following identities, namely, sn $u_1$=sin ψ and $$\psi = \sin^{-1}\sqrt{\frac{a^2 - y^2}{a^2 - b^2}}.$$

The solution for Equation (15) is set forth below.

$$h_1 - h_2 = A \cdot \frac{km}{n^2} \cdot \left[E(k_n) - \frac{n^2}{m^2} K(k_n)\right] \quad (17)$$

$$k_n^2 = 1 - \frac{n^2}{m^2}$$

Note here that $K(k_n)$ and $E(k_n)$ are complete elliptic integrals of the first and second kind to modulus $k_n$. The solution for Equation (17) for n now involves extraction of $k_n$ such that the left-hand side is satisfied. It is very useful to obtain an initial value of n to rapidly converge to a solution for Equation (17). An approximate closed-form solution for n may be obtained by further simplifying the integrand such that $(1-m^2 t^2) \approx -m^2 t^2$, thereby providing the following relationship.

$$h_1 - h_2 = A \cdot \frac{km}{n^2} \cdot k_n. \quad (18)$$

(See also §2.263.1 of I. S. Gradshteyn, et al.).

One may then use the solution for Equation (18) as either an initial value to solve Equation (17) or simply as an approximate value to the solution. It can be demonstrated that using the approximate value for Equation (18) could have a negligible effect on the final accuracy (less than, for instance, 0.5 percent). The aforementioned relationships and resulting solutions characterize the transformation z(t) from the z-plane to the T-plane.

The final transformation from the T-plane to the w-plane may be achieved via the transformation w(T) for symmetric problems yielding the following relationship.

$$w(T)=\sin^{-1} T. \qquad (19)$$

(See also, I. S. Gradshteyn, et al., §2.263.1).

The two pole faces now transform to the w-plane along the vertical edges EB and FC at $u=\mp\pi/2$ as shown in the w-plane of FIG. 6C. A uniform field then exists between the faces EB and FC and at $u=\pi/2$ as set forth below.

$$t = \cosh v \qquad (20)$$
$$v = \ln\left[t + \sqrt{t^2 - 1}\right].$$

Finally, the reluctance of the flanged gap per unit normal length is determined from the reluctance of the uniform gap of faces EB and FC as set forth below.

$$R/m = \frac{\pi/\mu_0}{\ln\left[\dfrac{t_F + \sqrt{t_F^2 - 1}}{t_C + \sqrt{t_C^2 - 1}}\right]}. \qquad (21)$$

With tc=1, the inductance per turn per unit normal length is illustrated in the relationship below.

$$L/m/\text{turn}^2 = \frac{\mu_0}{\pi}\ln\left[t_F + \sqrt{t_F^2 - 1}\right] \qquad (22)$$

The preceding analysis was used to calculate the properties (e.g., the inductance) of the micromagnetic device 500. The analysis may be compared to a numerical simulation using magnetostatic finite element analysis (FEA). The traditional uniform gap field approximation is used for comparison. Employing the following dimensions (in $\mu$m) for the micromagnetic device 500, g=20
a=200
$h_1$=460
$h_2$=200 the inductance (using the FEA) is 25.53 $\mu_0$H/m. This is considered to be a baseline for comparison purposes. The inductance using the uniform field approximation is given by, $$L_{uniform} = \frac{h_1}{g}\mu_0 = 23\mu_0 = 28.9 \text{ }\mu\text{H}/m.$$

and provides an error of about 9.9 percent. The hyperelliptic transformation is applied to yield, 1/k=3.33×10$^{15}$ k/m=21.27 m/n=1.50 and the inductance is now calculated as indicated below.

$$L_{hyper} = \frac{2\mu_0}{\pi}\ln\left[t_N + \sqrt{t_N^2 + 1}\right] = 25.4\mu_0 = 31.9 \text{ }\mu\text{H}/m.$$

The accuracy of the inductance calculation is increased to provide an error of about 0.5 percent. The exact value of m/n is obtained by solving Equation (17) above. Employing the approximate solution of Equation (18) leads to a value of m/n equaling 1.26. The resulting error is still only about 0.9 percent.

It is noteworthy that the accuracy is even more crucial when the gap is larger since the uniform-gap solution further deteriorates.

For example, if the gap is doubled to 40 $\mu$m, the FEA result is 15.2 $\mu_0$H/m. The inductance for a uniform field assumption is 11.5 $\mu_0$H/m, yielding an error of about 24 percent. The hyperelliptic analysis, however, accounts for the fringing around the flange to provide an inductance of 13.9 $\mu_0$H/m, yielding an error of about 8 percent. These results are summarized in Table 1 in units of $\mu$H/m.

TABLE 1

COMPARISON OF METHODS
INDUCTANCE PER METER IN $\mu$H/m

| Gap, [$\mu$m] | Hyper-elliptic | error, [%] | Uniform Field | error, [%] |
|---|---|---|---|---|
| 20 | 31.9 | −0.5 | 28.9 | −9.9 |
| 40 | 17.5 | −8.6 | 14.5 | −24.3 |

Figure 7:
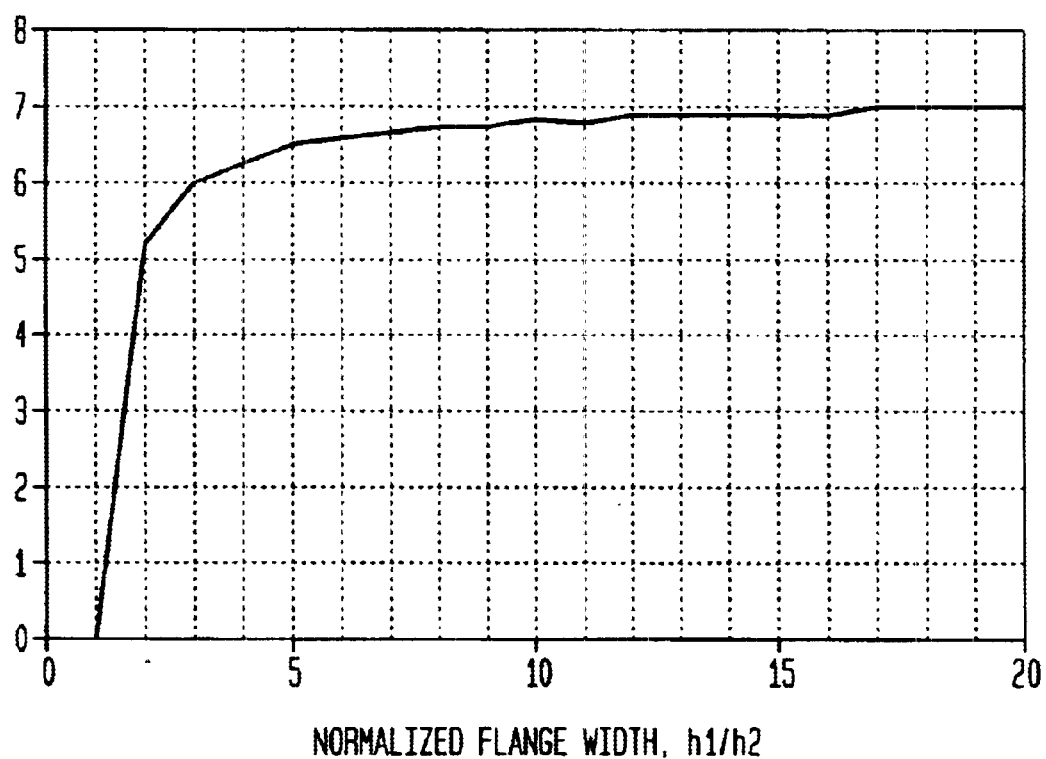
FIG. 7 illustrates a graph showing a percentage increase in inductance relative to a non-flanged structure for a normalized flange width h1/h2.

Turning now to FIG. 7, illustrated is a graph showing a percentage increase in inductance relative to a non-flanged structure for normalized flange width h1/h2. The presence of the flange reduces the curvilinear nature of the fringing field. As a result, the inductance increases with a larger flange. In designing such a gapped structure, one encounters the choice of the flange dimension $h_1$ and its relation to dimension $h_2$, as demonstrated in FIG. 6A. It is important not to increase the size of the flange beyond necessity since this results in a large wasted substrate area, which negatively impacts cost. In a practical implementation, the flange cannot be made zero as well.

The value of the dimension $h_1$, largely determines the inductance to first order, but the ratio of $h_1/h_2$ can be made large enough so that the inductance becomes solely determined by the dimension $h_1$. Using the solutions of the hyperelliptic transformation, the excess inductance obtained shows a saturating behavior with larger values for the ratio $h_1/h_2$. These characteristics are shown in FIG. 7. When $h_1/h_2>5$, the inductance no longer increases and there is no need to have a flange any wider. The percent inductance increase is about 7 percent. The graph provides the basis for the choice of the flange dimension $h_1$, without compromising substrate footprint area and device cost.

In summary, a method has been demonstrated to treat fringing magnetic fields in a five vertex magnetic core geometry with flanged gaps. Hyperelliptic transformations that arise cannot be solved in closed form. However, an analytic, closed-form procedure to reduce the relationships to elliptic integrals and the associated computations has herein been described. Using the procedure, errors of less than 1 percent are achievable, where using the approximate uniform field solutions result in errors of 10 percent for small gaps (e.g., 1–20 $\mu$m) and 24 percent for larger gaps (e.g., 20–100 $\mu$m). The method is used to design flanges for planar thin film micromagnetic devices (e.g., inductors or transformers) resulting in minimal footprint areas.

Figure 8:
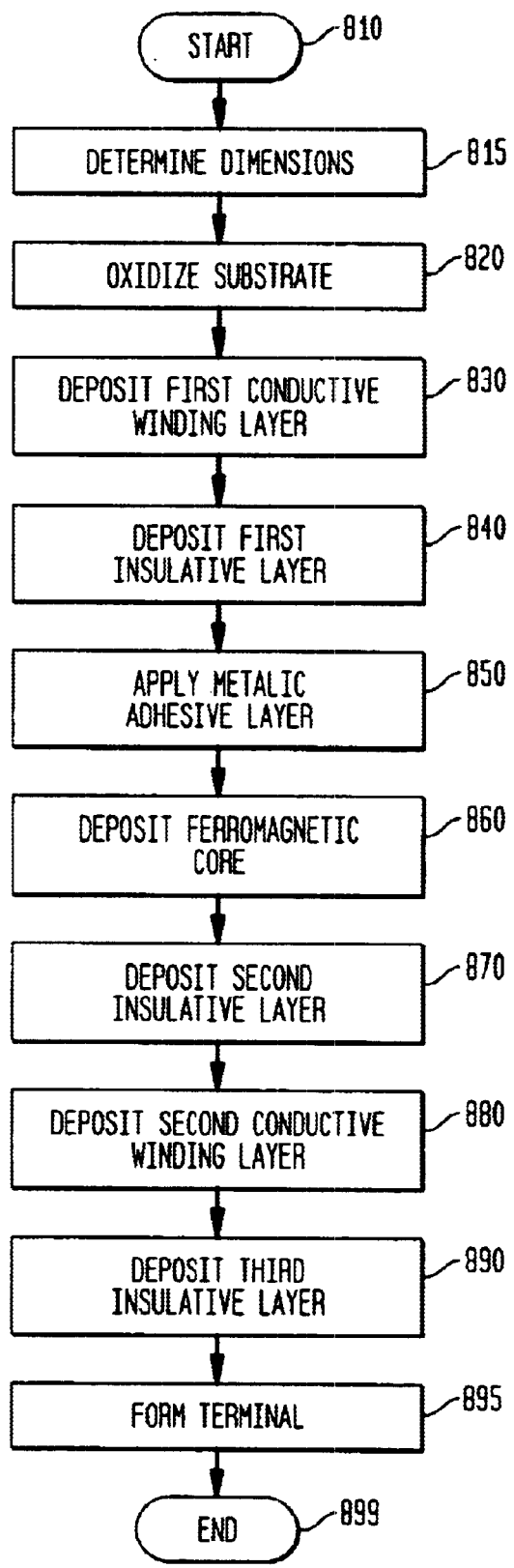
FIG. 8 illustrates a flow diagram of an embodiment of a method of manufacturing the integrated circuit of FIG. 4.

Turning now to FIG. 8, illustrated is a flow diagram of an embodiment of a method (generally designated 800) of manufacturing an integrated circuit according to the principles of the present invention. The method of manufacturing the integrated circuit is analogous to conventional silicon-on-silicon multi-chip-module processes [see *Silicon-* on-Silicon MCMs with Integrated Passive Components, by R. C. Frye, et al., Proc. 1992 IEEE Multi-Chip Module Conference, p. 155, Santa Cruz, Calif. (March 1992), which is incorporated herein by reference] with the following variations. Generally, a photolithographic process with photoresist is used to define the geometrical features of the integrated circuit based upon a 10–20 μm design rule. While the rule is relatively coarse, it is adequate for fabricating devices such as the integrated circuit 400 since the major dimensions are multiples of the 10–20 μm rule. The photolithographic process generally includes the steps of exposing and developing the photoresist. The photolithographic process also includes etching and stripping away unwanted portions of the material to which the process is being applied. Those skilled in the art should be familiar with conventional photolithographic processes.

The integrated circuit employs a toroidal structure that includes multiple layers. The method begins at a start step 810. The dimensions of the structure are first determined in a step 815. Recall that the integral transformation may be hyperelliptic, and that the integral transformation can be evaluated numerically for a set of transformation parameters. However, the reverse problem of determining the transformation parameters for a given physical geometry is typically quite difficult, since the hyperelliptic integral cannot be expressed in terms of complete elliptic integrals. The mathematical treatment then uses geometric properties to reduce hyperelliptic integrals to complete elliptic integrals and allows the computation of the transformation parameters directly from a given geometry.

After determining the dimensions for the structure, a silicon substrate is oxidized with a passivation layer in an oxidize substrate step 820. The passivation layer is generally created using conventional thermal growing techniques or chemical vapor deposition techniques. Of course, the substrate may be blank or may be composed of a pre-fabricated wafer with underlying circuitry and final passivation. The first conductive winding layer is then blanket deposited on the substrate during a deposit first conductive winding layer step 830. The first conductive winding layer may be composed of aluminum, having a thicknesses of about 2–10 μm, that is sputter deposited (for instance, at 5 mtorr Argon pressure and room temperature) on the passivation layer. For thicker conductor traces (to achieve lower resistance), electroplated copper may be used, resulting in thicknesses up to about 25 μm.

The first conductive winding layer is then patterned to the desired configuration (including the desired contact regions for the integrated circuit) using a conventional photolithographic process. Of course, another contact region may be formed in the first conductive winding layer to facilitate electrical connectivity to other circuits coupled to the substrate. The first insulative layer is then spin coated on the passivation layer and the first conductive winding layer during a deposit first insulative layer step 840. The first insulative layer is then cured (at about 350° C. for approximately 12 hours). After shrinkage, the insulative layer is about 3–5 μm thick. The spin coating techniques generally provide higher voltage isolation between the primary and secondary windings. Generally, the voltage level breakdown values for isolation vary from 500 volts alternating current ("VAC") to 3000 VAC. The first insulative layer is then patterned using a conventional photolithographic process to form inner-layer vias therethrough.

The metallic adhesive, including the first and second adhesive layers, is blanket deposited on the first insulative layer during an apply metallic adhesive layer step 850. The first adhesive layer may be composed of chromium, sputter deposited (for instance, at 5 mtorr Argon pressure and 250° C.) to a thickness of about 250 Å on the first insulative layer. The second adhesive layer may be composed of silver, sputter deposited (for instance, at 5 mtorr Argon pressure and room temperature) to a thickness of about 500 Å on the first adhesive layer. The metallic adhesive also serves as a seed layer for plating the ferromagnetic core. The ferromagnetic core is deposited (e.g., electroplated to a thickness of about 2–12 μm) on the metallic adhesive during a deposit ferromagnetic core step 860. The ferromagnetic core may be plated in a buffered sulfamate bath under a controlled temperature (e.g., 25–35° C.) with a current density of about 30 mA/cm$^2$. The metallic adhesive and ferromagnetic core are patterned to the desired configuration using a photolithographic process. With regard to the photolithographic process, the etching solutions should be capable of removing the unwanted metallic adhesive (e.g., chromium-silver composition) without attacking the deposited ferromagnetic film. For instance, a standard commercial cerric ammonium nitrate ("CAN") formulation etch solution etches the silver at the rate of about 50 Å/sec and etches the chromium at the rate of 250 Å/min without substantially affecting the ferromagnetic material. Thus, employing a CAN etch for approximately 60–75 seconds is adequate to pattern the metallic adhesive and ferromagnetic core. Again, the first adhesive layer (e.g., chromium) is preferably deposited in the range of 200–300 (250 nominal) Å and the second adhesive layer (e.g., silver) is preferably deposited in the range of 400–600 (500 nominal) Å to facilitate a controllable etch process.

Furthermore, to eliminate possible lateral etching and undercutting beneath the ferromagnetic core, the second adhesive layer may be composed of copper. In this case, a potassium iodide and water solution may be applied for about 10 seconds to perform the copper etching process and a potassium ferri-cyanide and potassium hydroxide solution may be applied for about 1–2 seconds to perform the chromium etching process. The potassium ferri-cyanide and potassium hydroxide solution does not substantially affect the copper layer underlying the ferromagnetic core, thereby preventing the potential affects of undercutting. Of course, other types of etching processes (such as ion etching) are well within the broad scope of the present invention. Additionally, an external magnetic field, as described in FIG. 2B, may be applied during the deposit ferromagnetic core step 860 to achieve a tailored B-H curve and, for instance, a specific permeability.

The second insulative layer is spin coated on the ferromagnetic core and the first insulative layer during a deposit second insulative layer step 870. The second insulative layer is then patterned using a photolithographic process to form the inner-layer vias therethrough. The second conductive winding layer is then blanket deposited (e.g., sputtered) on the second insulative layer during a deposit second winding conductive layer step 880. The second conductive winding layer is then patterned to the desired configuration (including the desired contact regions) using a photolithographic process. Next, the third insulative layer is spin coated on the second conductive winding layer and the second insulative layer during a deposit third insulative layer step 890. A terminal is finally formed in the third insulative layer during a form terminal step 895. The terminal is suitable for wire bonding (e.g., aluminum wire bonding) or is finished with a solder-wettable metal (e.g., chromium) for use with solder pastes for flip-chip assembly. The method terminates at an end step 899. A completed wafer may then be packaged as an integrated circuit or bare die mounted as in flip-chip assemblies.

Figure 9A:
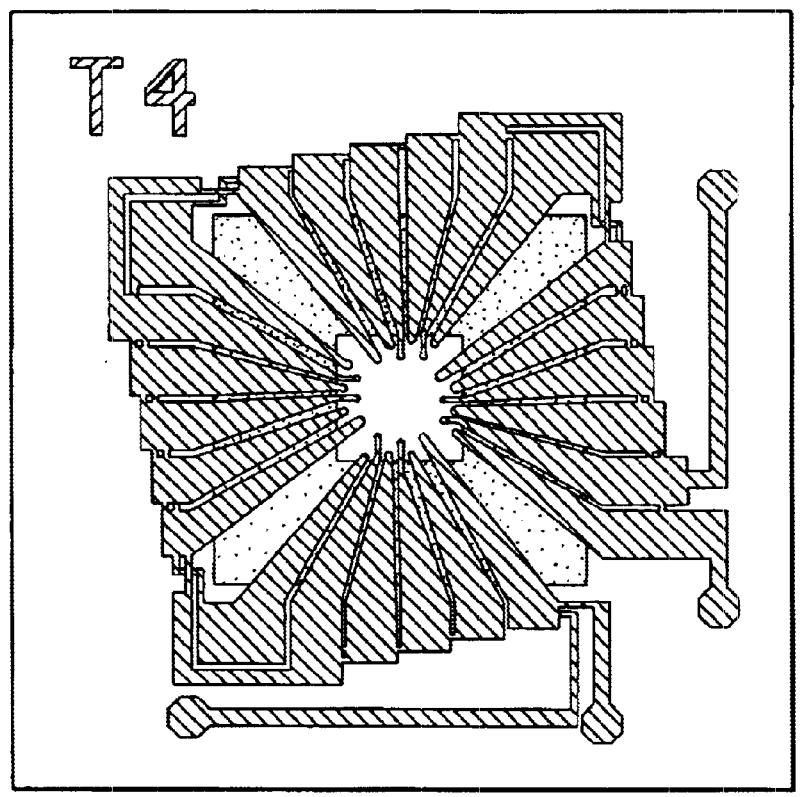
FIGS. 9A–9G illustrate a top views of other embodiments of a micromagnetic device constructed according to the principles of the present invention.
Figure 9B:
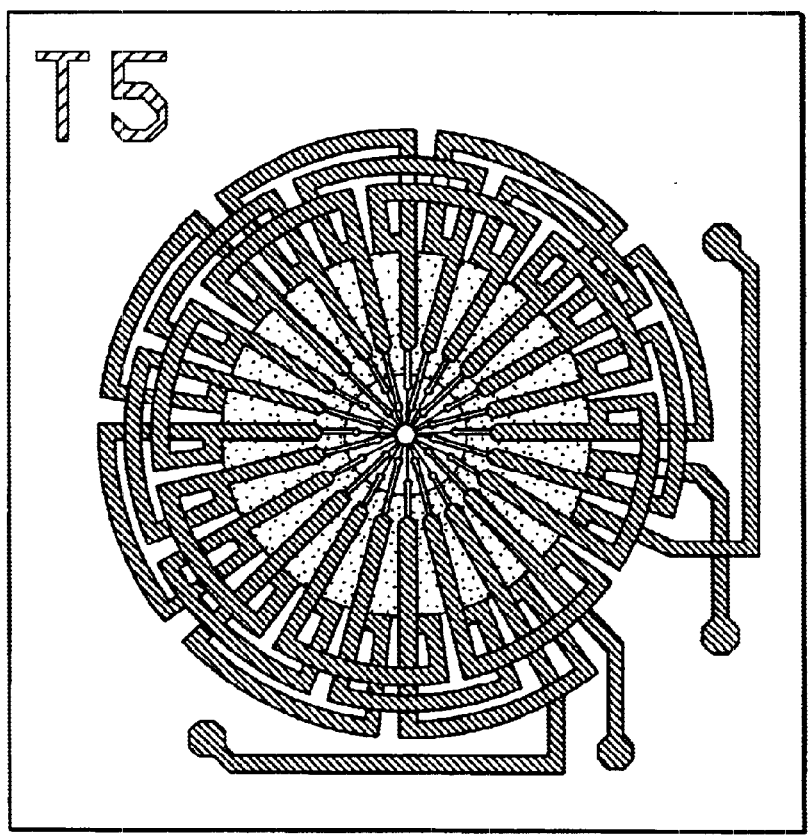
Figure 9C:
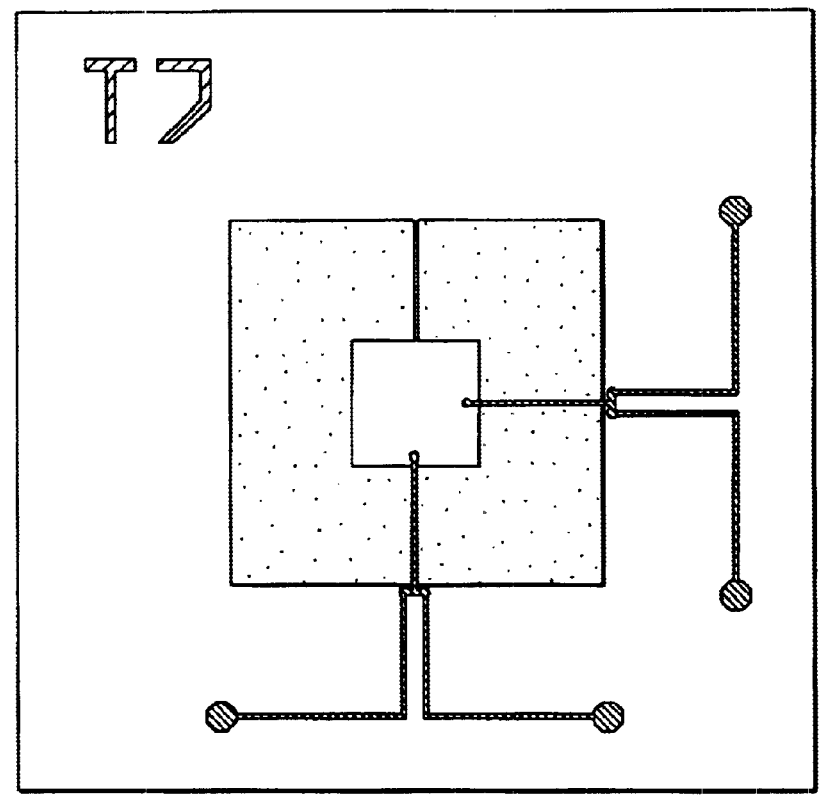
Figure 9D:
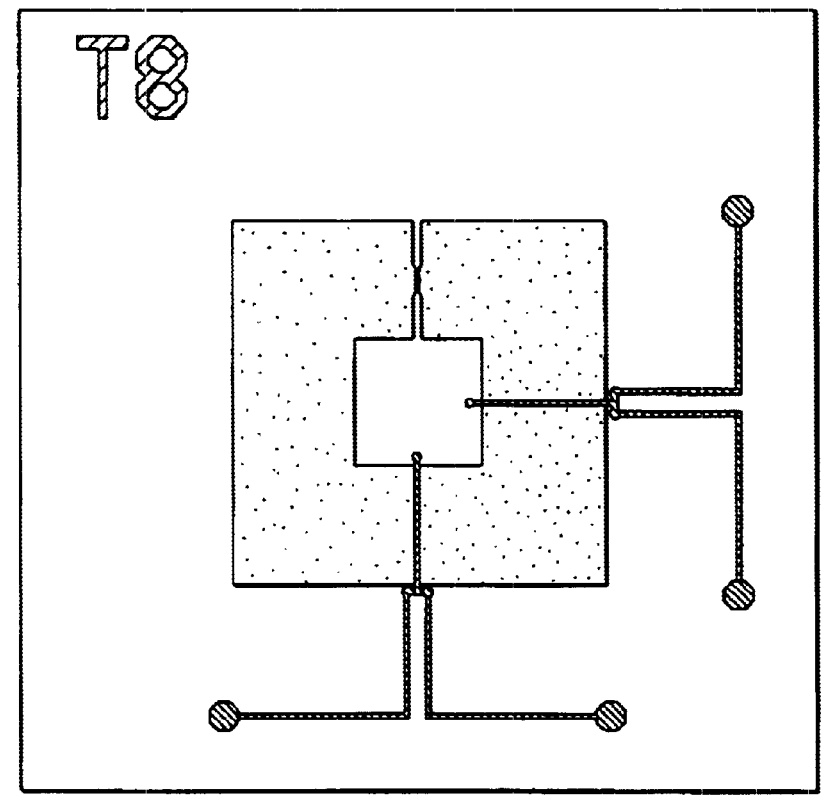
Figure 9E:
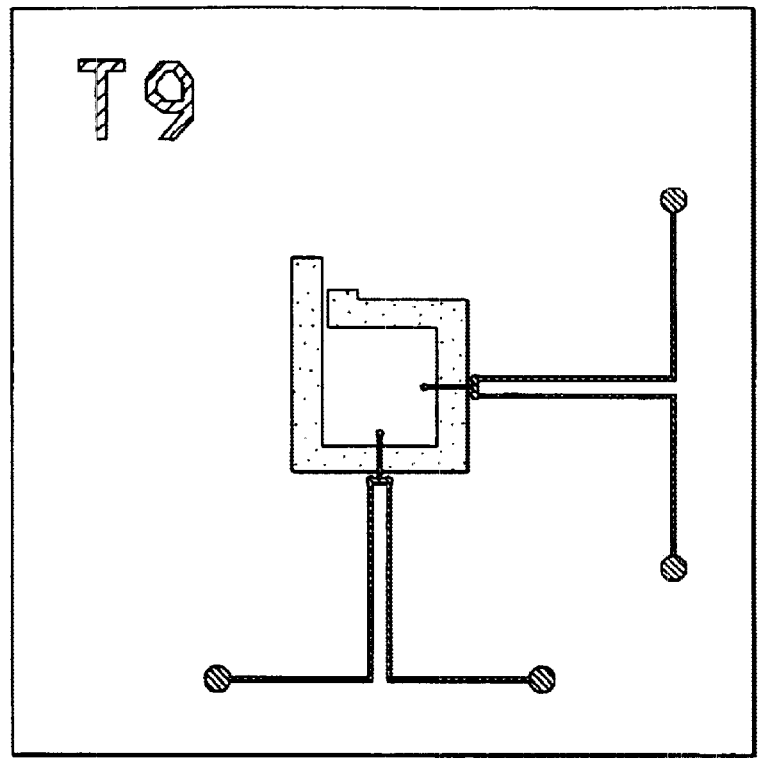
Figure 9F:
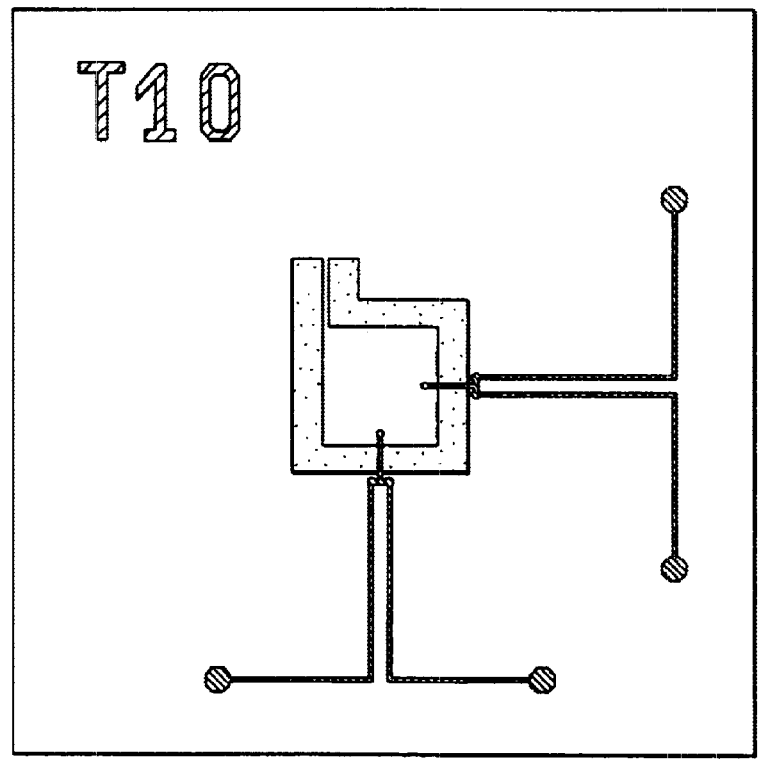
Figure 9G:
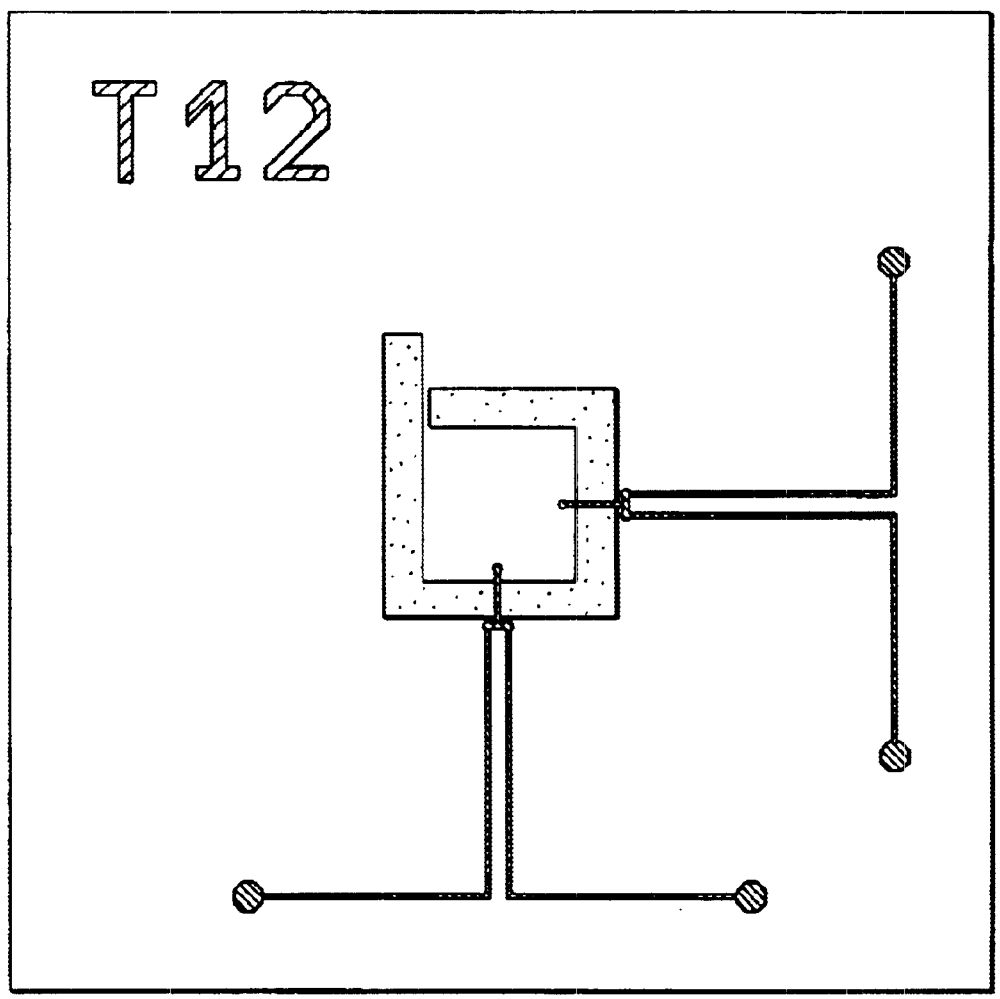

Turning now to FIG. 9A through FIG. 9G, illustrated are top views of other embodiments a micromagnetic device constructed according to the principles of the present invention. FIGS. 9A and 9B illustrate diagrams of transformer winding shapes that conformally wrap around a transformer core. FIGS. 9A and 9B illustrate two different solutions that produce "highly effective wiring", which have the desirable property of occupying the majority of the area available. Structures such as these, that provide high space utilization, may be integrated into the design stage using the techniques discussed earlier to fabricate the micromagnetic devices.

Another aspect is the ability to design very fine features into the magnetic core with essentially zero incremental cost. FIGS. 9C through 9G illustrate some of the possible geometries, which would be extremely costly and often practically impossible to accomplish with bulk magnetic cores. This capability in micromagnetic devices allows improvement in the response of the devices by minimizing magnetic flux fringing through the use of the conformal mapping techniques discussed above.

More specifically, FIGS. 9C to 9G illustrate diagrams whereby a core of the micromagnetic devices have a narrow fixed gap, a non-uniform gap, a small flanged gap, a large flanged gap, and a non-flanged gap, respectively.

While the preceding FIGUREs illustrate embodiments of an integrated circuit for use in power processing and data transmission applications and method of manufacture (including the photolithographic process) therefor, other applications, variations and methods of manufacture therefor are well within the broad scope of the present invention. It should also be clear that the precise dimensional and other quantitative information and the specified materials are submitted for illustrative purposes only.

For a better understanding of integrated circuits and methods of manufacture therefor see *Handbook of Sputter Deposition Technology,* by K. Wasa and S. Hayakawa, Noyes Publications (1992); *Thin Film Technology,* by R. W. Berry, P. M. Hall and M. T. Harris, Van Nostrand (1968); *Thin Film Processes,* by J. Vossen and W. Kern, Academic (1978); and *Handbook of Thin Film Technology,* by L. Maissel and R. Glang, McGraw Hill (1970). For a general reference regarding electronics including data transmission systems see *Reference Data for Engineers: Radio, Electronics, Computers and Communications,* 7th edition, Howard W. Sams & Company (1988) and power electronics, power magnetic devices and power converter topologies see *Principles of Power Electronics,* by J. Kassakian, M. Schlecht, Addison-Wesley Publishing Company (1991). The aforementioned references are incorporated herein by reference.

Although the present invention has been described in detail, those skilled in the art should understand that they can make various changes, substitutions and alterations herein without departing from the spirit and scope of the invention in its broadest form.

What is claimed is:

1. An integrated circuit formed on a substrate, comprising:

an insulator formed over said substrate;

an adhesive formed over said substrate; and a micromagnetic device including a ferromagnetic core coupled to said adhesive, said adhesive forming a bond between said insulator and said ferromagnetic core, said ferromagnetic core having first and second magnetic core portions separated by a flanged gap.

2. The integrated circuit as recited in claim 1 wherein said ferromagnetic core has a magnetic flux density that is about uniform.

3. The integrated circuit as recited in claim 1 wherein said micromagnetic device further comprises at least one winding proximate said ferromagnetic core.

4. The integrated circuit as recited in claim 3 further comprising an insulator between said at least one winding and said ferromagnetic core.

5. The integrated circuit as recited in claim 1 wherein said micromagnetic device is selected from the group consisting of:

an inductor, a transformer.

6. The integrated circuit as recited in claim 1 further comprising a passivation layer formed over said substrate.

7. The integrated circuit as recited in claim 6 wherein said passivation layer includes an organic polymer.

8. The integrated circuit as recited in claim 1 wherein said adhesive is a metallic adhesive.

9. The integrated circuit as recited in claim 1 wherein said integrated circuit is selected from the group consisting of:

a power processing circuit, and a data transmission circuit.

* * * * *